(12) United States Patent
Jung (10) Patent No.: US 7,842,350 B2
(45) Date of Patent: Nov. 30, 2010

(54) METHOD AND APPARATUS FOR COATING A PHOTOSENSITIVE MATERIAL

(75) Inventor: Sung-Ki Jung, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 1071 days.

(21) Appl. No.: 11/247,252

(22) Filed: Oct. 12, 2005

(65) Prior Publication Data

US 2006/0027164 A1     Feb. 9, 2006

Related U.S. Application Data

(62) Division of application No. 10/426,619, filed on May 1, 2003, now Pat. No. 6,974,600.

(30) Foreign Application Priority Data

Jun. 14, 2002   (KR) .................... 10-2002-0033320

(51) Int. Cl.
*B05D 1/02* (2006.01)
(52) U.S. Cl. ................ 427/427.2; 427/420; 427/427.3; 118/321; 118/323
(58) Field of Classification Search .............. 118/320, 118/321, 323, 410, 421, 679, 680, 681; 427/420, 427/427.2, 427.3
See application file for complete search history.

(56) References Cited

U.S. PATENT DOCUMENTS

| | | | |
|---|---|---|---|
| 5,958,647 A * | 9/1999 | Morgan ................... | 430/270.1 |
| 6,037,107 A | 3/2000 | Thackeray et al. | |
| 6,258,167 B1 * | 7/2001 | Kawano et al. ............. | 118/667 |
| 6,475,282 B1 | 11/2002 | Snodgrass et al. | |
| 6,478,483 B2 * | 11/2002 | Maruyama et al. .......... | 396/604 |
| 6,540,833 B1 * | 4/2003 | Gibson et al. ............... | 118/410 |
| 6,544,590 B1 | 4/2003 | Kodera et al. | |
| 2003/0008066 A1 * | 1/2003 | Yoshihara et al. ........... | 427/240 |

FOREIGN PATENT DOCUMENTS

| | | |
|---|---|---|
| JP | 4-221956 | 8/1992 |
| JP | 07-213992 | 8/1995 |
| JP | 11-119417 | 4/1999 |
| JP | 2001-028122 | 1/2001 |
| JP | 2001-70858 | 3/2001 |
| JP | 2001-310147 | 11/2001 |
| JP | 2002-153795 | 5/2002 |
| KR | 1020010067414 A | 7/2001 |
| KR | 1020020025318 A | 4/2002 |

OTHER PUBLICATIONS

Translation of JP 2001-310147, published Nov. 2001.*
English Abstract of Pat. Pub.No. JP 2002-153795.
English Abstract of Pat. Pub.No. JP 11-119417.
English Abstract of Pat. Pub.No. JP 07-213992.
English Abstract of Pat. Pub.No. JP 2001-028122.

* cited by examiner

*Primary Examiner*—George R Koch, III
(74) *Attorney, Agent, or Firm*—Innovation Counsel LLP

(57) ABSTRACT

In a method and an apparatus for coating an object with photosensitive material, a roller stabilizes a supply amount of the photosensitive material and is disposed between the object and a slit coater, so that the stabilized photosensitive material is supplied to the object through the slit coater. The photosensitive material includes additives for controlling amount of a solid powder, a boiling point and a surface tension thereof. Accordingly, the photosensitive material may be uniformly coated on the object.

11 Claims, 11 Drawing Sheets

METHOD AND APPARATUS FOR COATING A PHOTOSENSITIVE MATERIAL

CROSS REFERENCE TO PRIOR APPLICATIONS

This application is a divisional of prior application Ser. No. 10/426,619, filed on May 1, 2003, now U.S. Pat. No. 6,974,600 which claims priority to and the benefit of Korean Patent Application No. 10-2002-0033320, filed on Jun. 14, 2002, which are hereby incorporated by reference for all purposes as if fully set forth herein.

BACKGROUND OF THE INVENTION

1. Field of the Invention

The present invention relates to a method and an apparatus for coating an object with a photosensitive material, and more particularly to a method and an apparatus for uniformly coating an object with a photosensitive material.

2. Description of the Related Art

As a conventional method for coating a semiconductor substrate with a photosensitive material in a sheet form, a spin coating method is used. In the spin coating method, the photosensitive material is dropped and coated on a substrate that is being quickly rotated. That is, the photosensitive material is coated by a centrifugal force that is applied to the substrate. The spin coating method is proper to coat a small substrate such as a wafer with the photosensitive material. However, the spin coating method may be improper to coat a large and heavy substrate such as an LCD panel with the photosensitive material.

In order to coat a large and heavy substrate with a photosensitive material, a slit coating method has been proposed. In the slit coating method, the photosensitive material is supplied through a slit nozzle having a length thereof longer than a width thereof and is coated in a sheet form.

Figure 1:
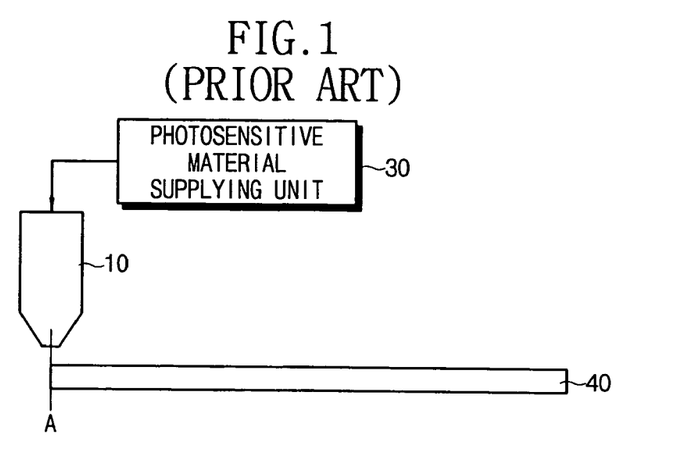
FIG. 1 is a schematic view showing a conventional slit coater.

FIG. 1 is a schematic view showing a conventional slit coater.

Referring to FIG. 1, a slit coater 10 changes a photosensitive material having an indeterminate form into a photosensitive material having a band form, which has a length thereof longer than a width thereof. The slit coater 10 is aligned at a designated position "A" so as to supply the photosensitive material onto a substrate 40.

Figure 2A:
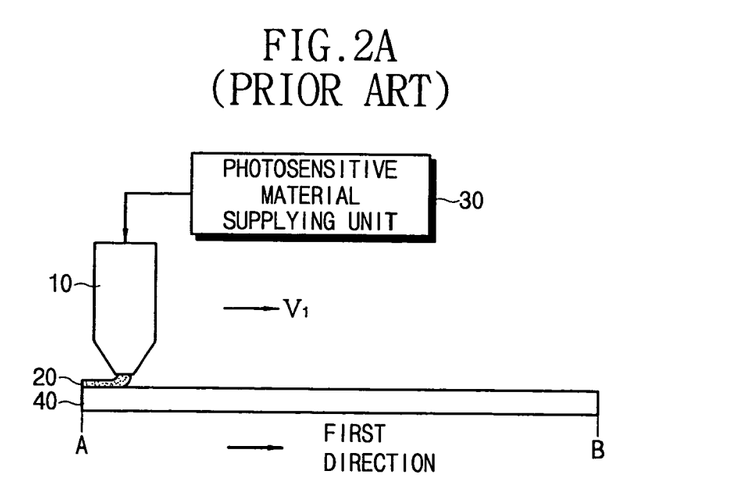
FIGS. 2A and 2B are views showing a the silt coater and a substrate partially coated with a photosensitive material.
Figure 2B:
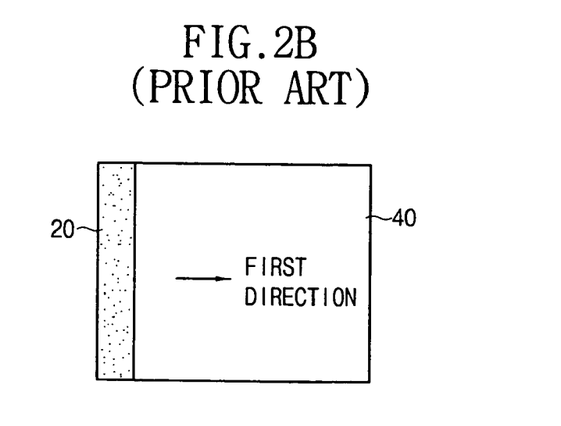

FIGS. 2A and 2B are views showing a silt coater and a substrate partially coated with photosensitive material.

Referring to FIG. 2A, the slit coater 10 supplies the photosensitive material 20 from a photosensitive material supply apparatus 30 to the substrate 40. The photosensitive material 20 supplied from the slit coater 10 has a band form as shown in FIG. 2B. The slit coater 10 coats the substrate 40 with the photosensitive material 20 in a first direction and at a first speed.

Figure 3A:
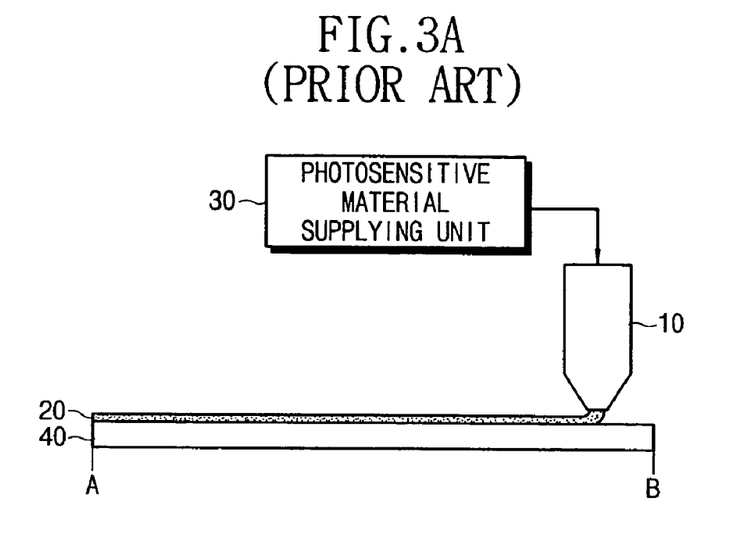
FIGS. 3A and 3B are views showing the substrate totally coated with a photosensitive material by the slit coater.
Figure 3B:
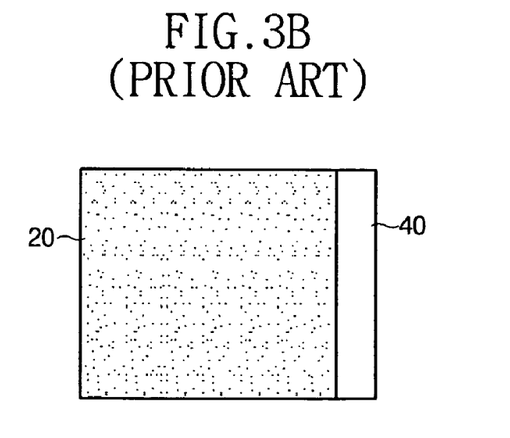

FIGS. 3A and 3B are views showing the substrate totally coated photosensitive material by the slit coater.

Referring to FIGS. 3A and 3B, the slit coater 10 coats the substrate 40 with the photosensitive material 20 from the first position "A" to a second position "B". In the slit coating method, the photosensitive material may be easily coated on an area of substrate greater than that of a wafer.

Figure 4:
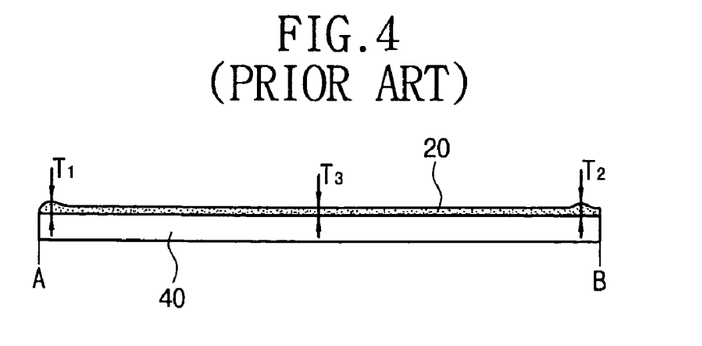
FIG. 4 is a sectional view showing a profile of the photosensitive material coated on the substrate according to a conventional slit coating method.

FIG. 4 is a sectional view showing a profile of the photosensitive material coated on the substrate according to the slit coating method.

Referring FIG. 4, in the slit coating method, a thickness T1 at the first position "A" and a thickness T2 at the second position "B" are different from a thickness T3 at a center of the substrate 40, which is unpreferable. Also, the slit coating method causes coating failure as wave patterns or scratch patterns in the coated photosensitive material. Accordingly, the slit coating and spin coating methods are successively performed so as to coat the photosensitive material on the substrate.

When both the slit coating method and the spin coating method are performed on the same substrate, the time for coating the substrate with the photosensitive material may greatly increase. Also, since equipments for performing the slit coating method and the spin coating method are respectively required, cost of equipments may increase.

BRIEF SUMMARY OF THE INVENTION

The present invention provides a method for coating a substrate with a photosensitive material, so as to have a uniform thickness.

The present invention provides an apparatus for coating a substrate with a photosensitive material, which is suitable for performing the above method.

In one aspect of the invention, in the method for coating a substrate with a photosensitive material, a fluid photosensitive material is changed into a photosensitive material having a band form that has a length longer than a width thereof. The photosensitive material having the band form is supplied onto a first surface for a first time period so as to stabilize a supply amount of the photosensitive material. The stabilized photosensitive material is supplied onto the substrate in a direction of the width thereof, which is separated from the first surface, so that the substrate is coated with the stabilized photosensitive material in a sheet form.

In another aspect of the invention, the apparatus for coating a substrate with a photosensitive material includes a forming part and a stabilizing part. The forming part changes a fluid photosensitive material into a photosensitive material having a band form such that a length thereof is longer than a width thereof. The stabilizing part supplies the photosensitive material having the band form onto a first surface for a first time period so as to stabilize a supply amount of the photosensitive material. Furthermore, the apparatus includes a fixing part and a transferring part. The fixing part fixes the substrate separated apart from the first surface and the transferring part supplies the stabilized photosensitive material onto the substrate in a direction of the width such that the substrate is coated with the stabilized photosensitive material in a sheet form.

According to the present invention, the supply amount of the photosensitive material is stabilized before the photosensitive material is supplied onto the substrate, so that the photosensitive material may be uniformly coated on the substrate.

BRIEF DESCRIPTION OF THE DRAWINGS

The above and other advantages of the present invention will become readily apparent by reference to the following detailed description when considered in conjunction with the accompanying drawings wherein.

DETAILED DESCRIPTION OF THE INVENTION

Figure 5:
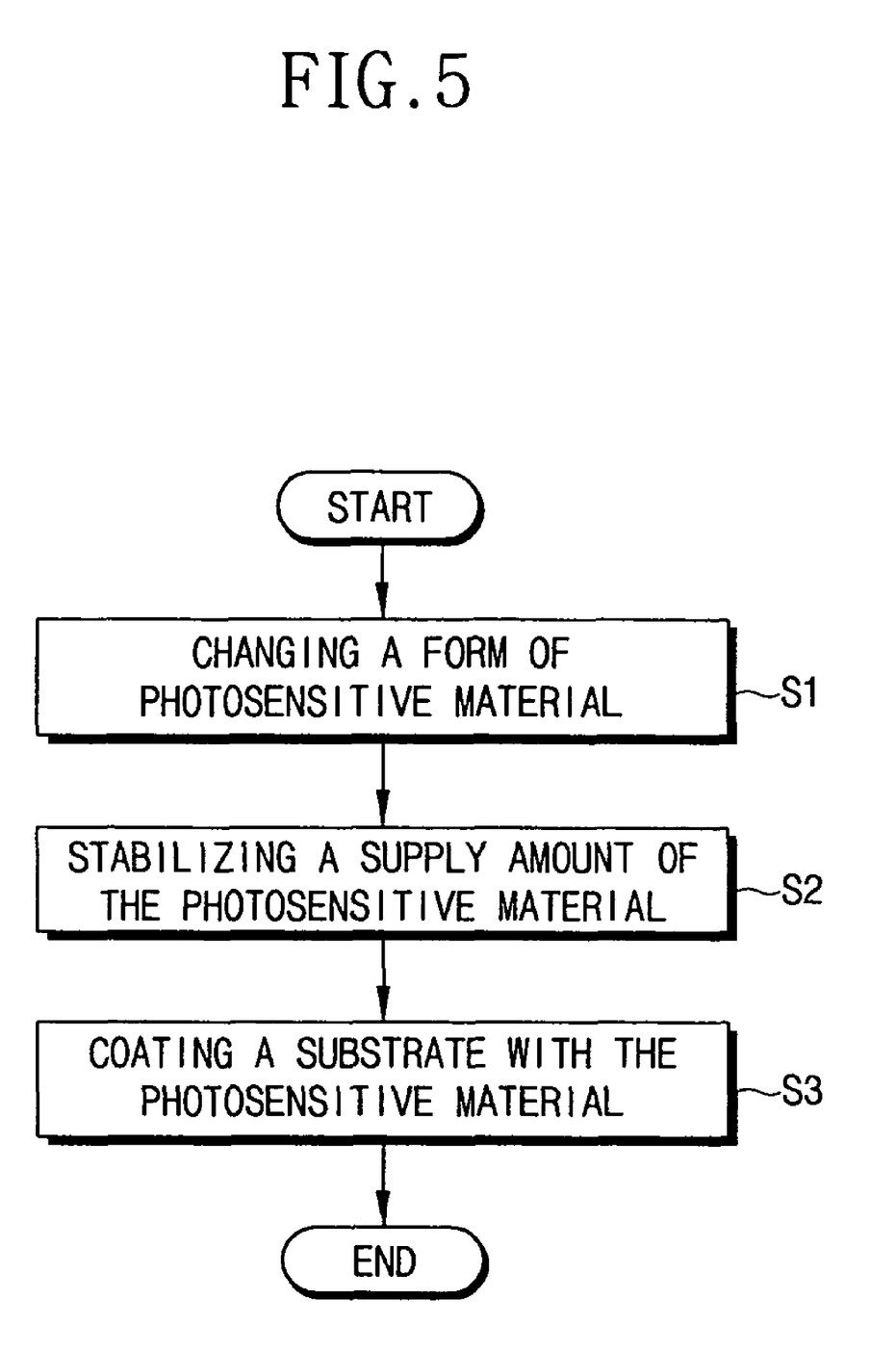
FIG. 5 is a flow chart showing a method for coating a substrate with a photosensitive material according to an exemplary embodiment of the present invention.

FIG. 5 is a flow chart showing a method for coating a substrate with a photosensitive material according to an exemplary embodiment of the present invention.

Referring to FIG. 5, in a method for coating a substrate with a photosensitive material, a form of a fluid photosensitive material is changed into a photosensitive material having a band form (step S1), a supply amount of the photosensitive material is stabilized before the photosensitive material is supplied onto the substrate (step S2) and the substrate is coated with the stabilized photosensitive material (step S3).

Particularly, in step S1, the fluid photosensitive material is changed into the photosensitive material having the band form, so that the photosensitive material has a length longer than a width thereof. The photosensitive material having the band form may be obtained by passing the fluid photosensitive material through a slot having a length longer than a width thereof. The above procedure is performed to coat the substrate with the photosensitive material in a sheet form.

The photosensitive material having the band form may be differently supplied to the substrate in the supply amount by positions of the substrate. That is, the photosensitive material is not uniformly coated on the substrate.

In order to prevent the photosensitive material from being non-uniformly coated on the substrate, the photosensitive material is stabilized (step S2) so that the photosensitive material is uniformly supplied onto the substrate after the fluid photosensitive material is changed into the photosensitive material having the band form.

In order to stabilize the supply amount of the photosensitive material, the photosensitive material having the band form is supplied to an object for test such as a roller, a plate or the like for a first time period before the photosensitive material is supplied to the substrate. The first time period is required for supplying a sufficient amount of the photosensitive material. The photosensitive material having the band form is supplied to the substrate continuously moving during the first time period from about 1 second to about 5 seconds.

After stopping the supplying of the photosensitive material, the photosensitive material is transferred to the substrate. The photosensitive material is pressurized at a predetermined pressure so as to coat the photosensitive material onto the substrate (step S3).

As aforementioned above, the photosensitive material having the band form is supplied to the substrate after stabilizing the supply amount of the photosensitive material having the band form discharged from the slit coater. Therefore, the photosensitive material may be uniformly coated on the substrate.

In order to uniformly coat the photosensitive material, the photosensitive material may include additives such as a solid powder that may chemically react on the light and a volatile solvent. The solid powder influences the viscosity of the photosensitive material. That is, the more the photosensitive material includes the solid powder, the more the viscosity of the photosensitive material rises. If the photosensitive material having a high viscosity is coated on the substrate, patterns such as spot patterns or scratch patterns may appear in the coated photosensitive material. Also, the viscosity of the photosensitive material greatly influences the coating speed of the photosensitive material. That is, the more the viscosity of the photosensitive material rises, the more the coating speed is lowered.

In order to prevent the decrease in the coating speed of the photosensitive material and the appearance of the patterns, the photosensitive material comprises the solid power from about 5 wt % to about 25 wt % and the volatile solvent from about 95 wt % to about 75 wt %.

Additionally, a drying time is an important factor in the photosensitive material. If the drying time of the photosensitive material is so reduced, the supply amount of the photosensitive material may be altered because the photosensitive material may be dried while being supplied onto the substrate and the photosensitive material may be randomly coated onto the substrate.

In order to control the drying time of the photosensitive material, the photosensitive material may further include a drying delaying agent for delaying the drying time thereof. As one of exemplary embodiments of the present invention in order to control the drying time, the photosensitive material may be mixed with the drying delaying agent having a boiling point higher than that of the volatile solvent.

However, if the amount of the drying delaying agent for delaying the drying time that is mixed with the photosensitive material is excessive, the drying of the photosensitive material may not be smoothly achieved. Accordingly, the photosensitive material includes the drying delaying agent from about 10 wt % to about 80 wt %. More preferably, the photosensitive material includes the drying delaying agent below about 50 wt %.

Further, the surface tension of the photosensitive material is greatly important factor. The surface tension of the photosensitive material influences the thickness uniformity of the photosensitive material coated onto the substrate.

In consideration of the influence thereof on the surface tension, the photosensitive material further includes a surfactant, for example, such as a fluorine-containing surfactant or a silicon-containing surfactant. In the exemplary embodiment of the present invention, the photosensitive material includes the surfactant from about 200 ppm to about 5,000 ppm.

Particularly, in step of coating the substrate with the photosensitive material (step S3), the photosensitive material is pressurized at a first pressure during a second time period so as to improve the thickness uniformity of the photosensitive material. The photosensitive material is allowed to stand-by during a third time period until the supply amount of the photosensitive material reaches to a target amount. After the third time period, the photosensitive material is discharged at a second pressure.

In detail, the photosensitive material is pressurized during the second time period, for example, approximately 0.1 second, until a pressure applied to the photosensitive material reaches to the first pressure. The photosensitive material is allowed to stand-by during the third time period, for example, approximately 0.7 second until the supply amount of the photosensitive material reaches to the target amount. Finally, the photosensitive material is discharged at the second pressure.

As another method, the photosensitive material is pressurized during the second time period, for example approximately 1 second, until a pressure applied to the photosensitive material reaches to the first pressure. The photosensitive material is allowed to stand by during the third time period, for example approximately 0.2 second until the supply amount of the photosensitive material reaches to the target amount. Finally, the photosensitive material is discharged at the second pressure. The third time period becomes shorter according as the first time period is longer.

Also, the thickness of the photosensitive material coated on the object for test in the stabilizing step (step S2) is very important because the thickness of the photosensitive material coated on the substrate depends on the thickness of the photosensitive material coated on the object for test. In this exemplary embodiment, the thickness of the photosensitive material coated on the object for test is from about 10 µm to about 200 µm.

In step S3, the thickness of the photosensitive material coated on the substrate is also important. In consideration of the coating thickness, the thickness of the photosensitive material coated on the substrate is measured at a first position of the substrate and at a second position of the substrate, which is spaced apart from the first position. The photosensitive material that remains in the slit coater is sucked and removed after the photosensitive material is coated on the substrate.

Finally, the photosensitive material coated on the substrate is dried without an additional process such as a spin coating.

Hereinafter, an apparatus according to the exemplary embodiment of the present invention will be described in detail with reference to accompanying drawings.

Figure 6:
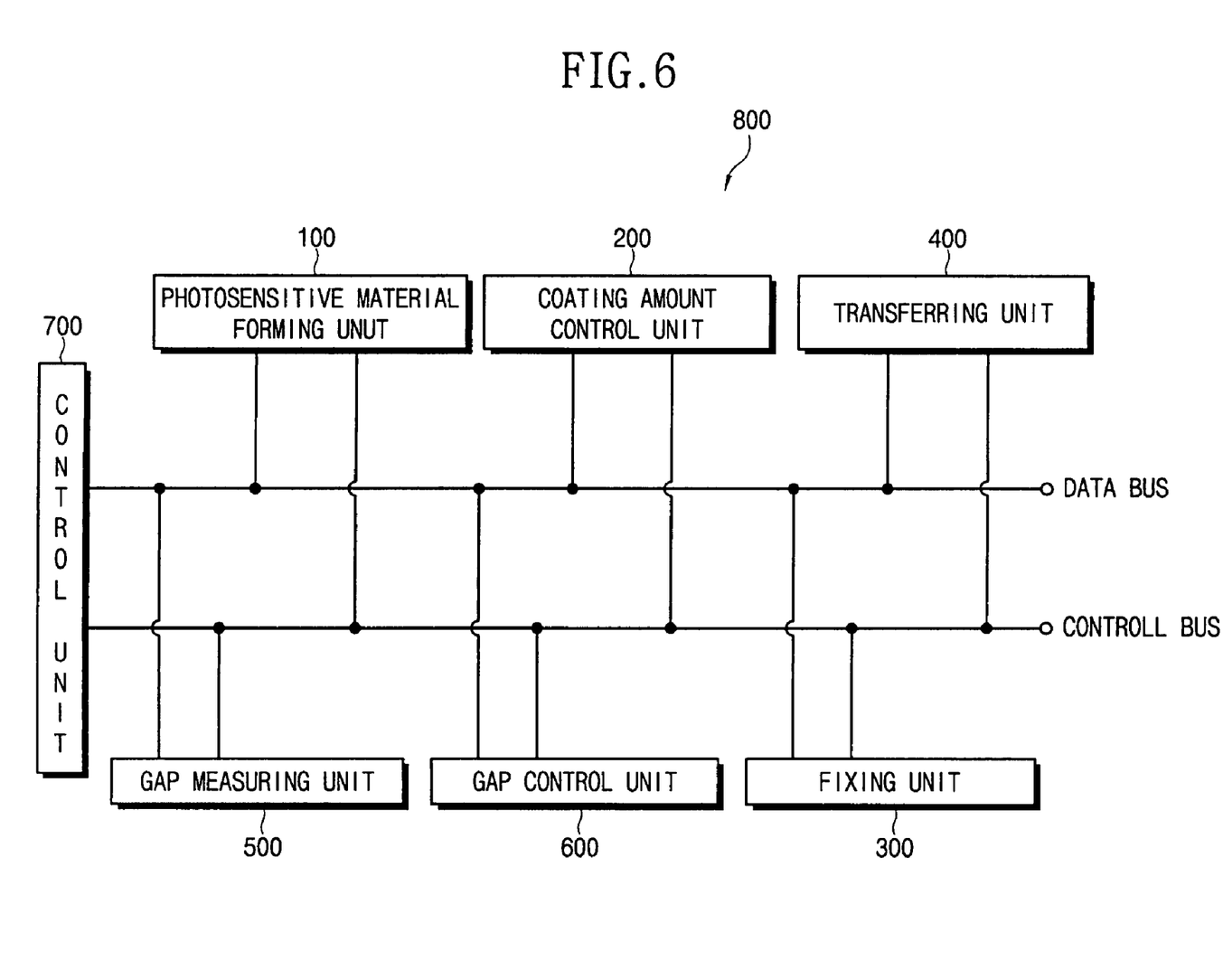
FIG. 6 is a block diagram showing an apparatus for coating a substrate with a photosensitive material according to an exemplary embodiment of the present invention.

FIG. 6 is a block diagram showing an apparatus for coating a substrate with photosensitive material according to an exemplary embodiment of the present invention.

Referring to FIG. 6, a photosensitive material coating apparatus 800 includes a photosensitive material forming unit 100, a coating amount control unit 200, a fixing unit 300, a transferring unit 400 and a control unit 700. The photosensitive material coating apparatus 800 further includes a gap measuring unit 500 and a gap control unit 600.

Figure 7:
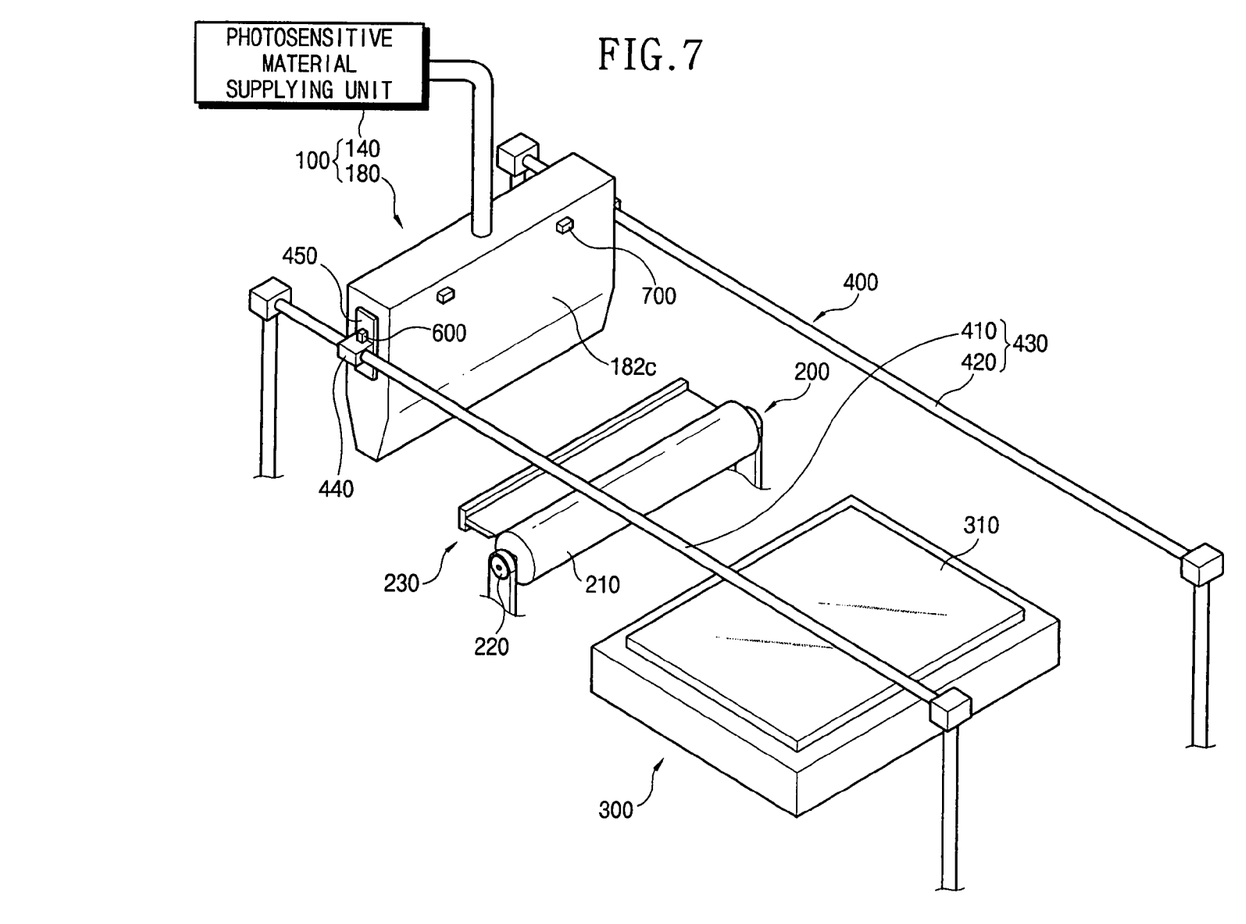
FIG. 7 is a perspective view showing an apparatus for coating a substrate with a photosensitive material.

FIG. 7 is a perspective view showing a constitution of the apparatus for coating the substrate with photosensitive material as shown in FIG. 6.

Referring FIG. 7, the photosensitive material forming unit 100 includes a photosensitive material supplying unit 140 and a slit coater 180. The photosensitive material forming unit 100 changes the fluid photosensitive material into the photosensitive material having the band form that has a length longer than a width thereof.

Figure 8:
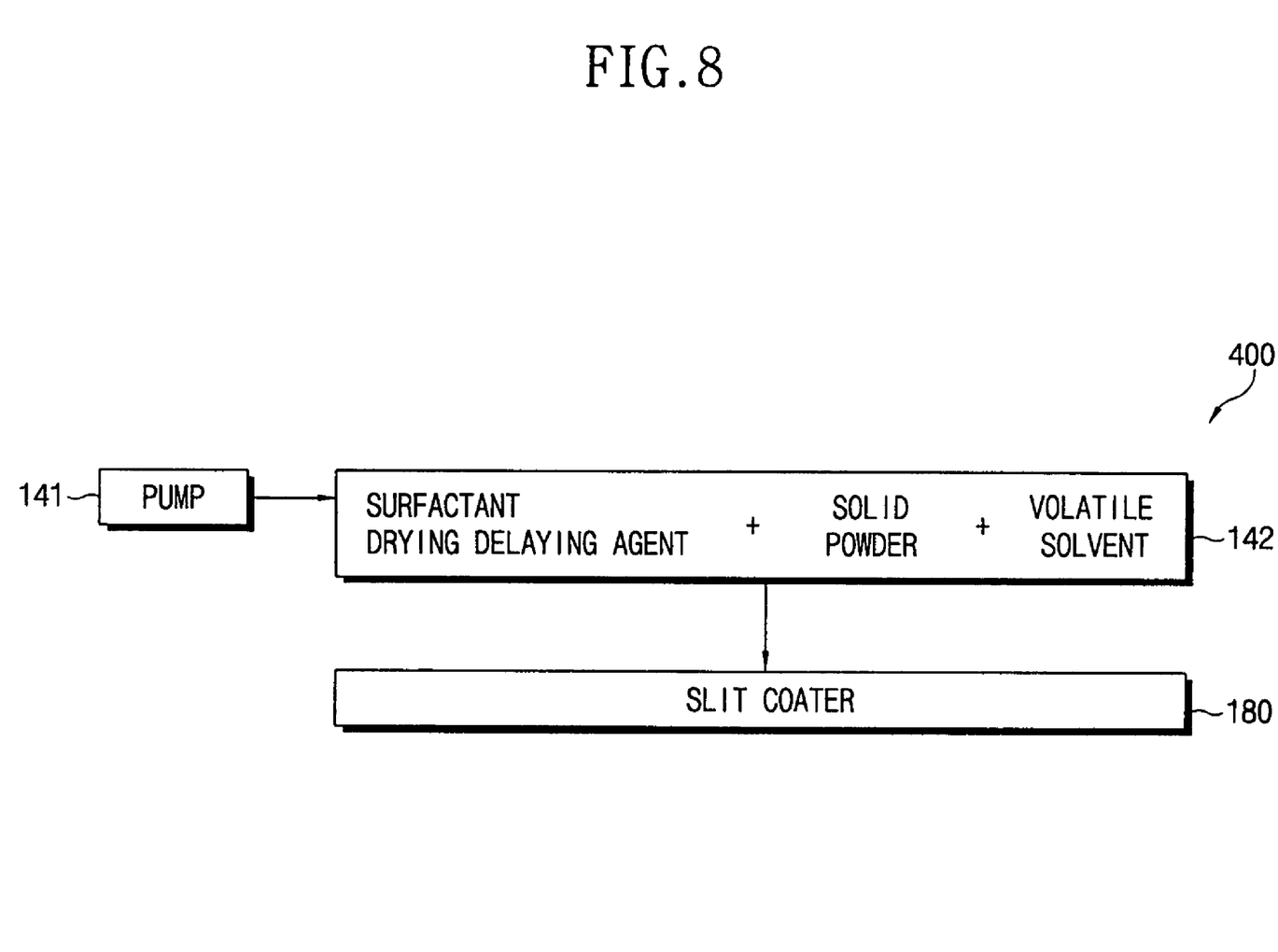
FIG. 8 is a schematic view showing a photosensitive material supplying unit according to an exemplary embodiment of the present invention.

FIG. 8 is a schematic view showing a photosensitive material supplying unit according to an exemplary embodiment of the present invention.

Referring to FIG. 8, the photosensitive material supplying unit 140 includes a pump 141 and a tank 142. The tank 142 stores the photosensitive material with additives.

The photosensitive material includes a solid powder from about 5 wt % to about 25 wt % and a volatile solvent from about 95 wt % to about 75 wt %.

The additives include a surfactant and a drying delaying agent. The photosensitive material includes the surfactant from about 200 ppm to about 5,000 ppm. The photosensitive material also includes the drying delaying agent from about 80 wt % to about 10 wt % having a boiling point higher than that of the photosensitive material.

The tank 142 stores the photosensitive material having the above compositions and the photosensitive material stored in the tank 142 is supplied to the slit coater 180.

Figure 9:
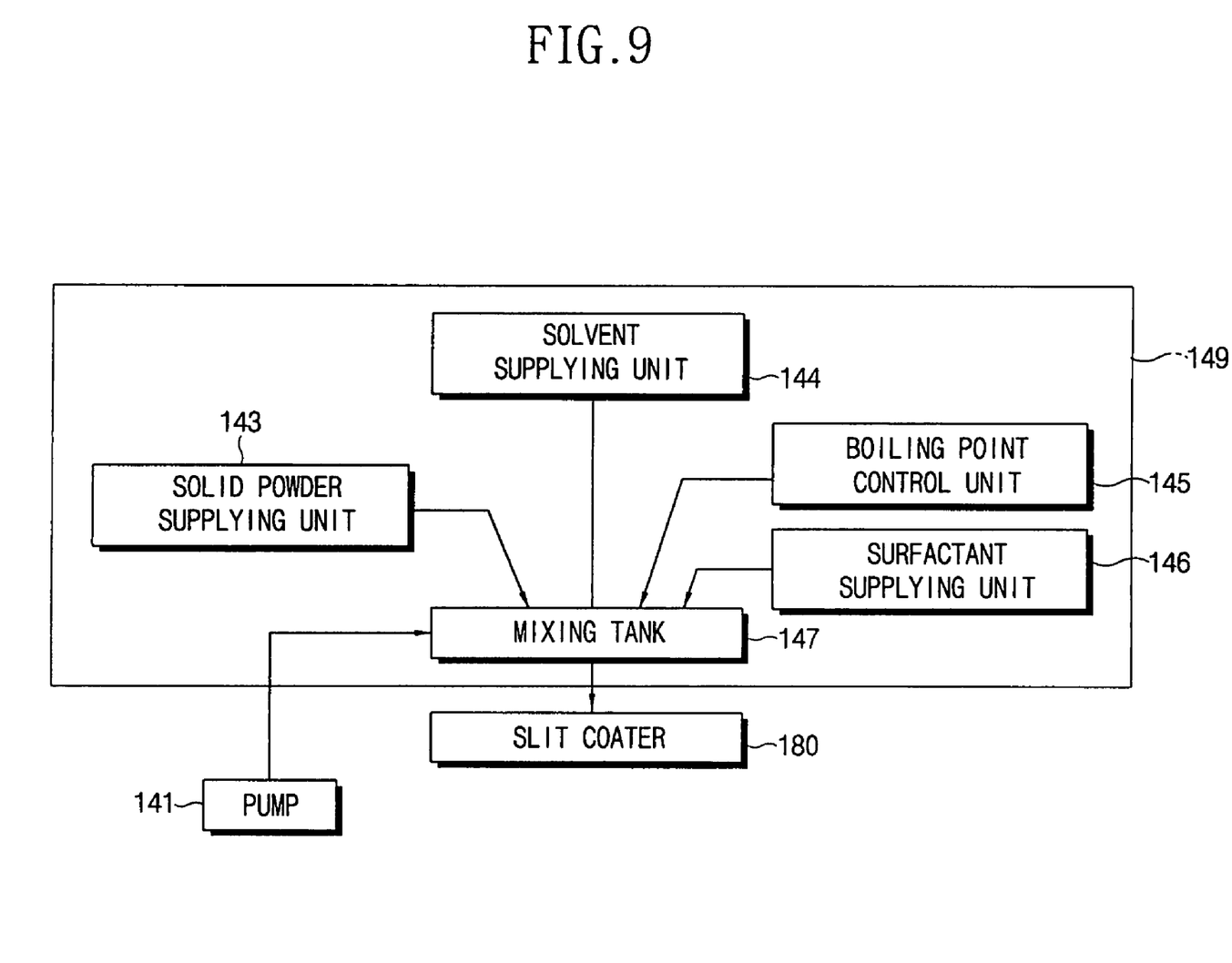
FIG. 9 is a schematic view showing a photosensitive material supplying unit according to another exemplary embodiment of the present invention.

FIG. 9 is a schematic view showing a photosensitive material supplying unit according to another exemplary embodiment of the present invention.

Referring to FIG. 9, a tank 149 includes a solid powder supplying unit 143, a solvent supplying unit 145, a boiling point control unit 145, a surfactant supplying unit 146 and a mixing tank 147.

The solid powder supplying unit 143 supplies the solid powder to the mixing tank 147. The solid powder supplying unit 143 may further include a control unit (not shown) to precisely supply the solid powder to the mixing tank 147. The photosensitive material in the mixing tank 147 includes the solid powder from about 5 wt % to about 25 wt %.

The solvent supplying unit 144 supplies the volatile solvent to the mixing tank 147. The solvent supplying unit 144 may further include a control unit (not shown) to accurately supply an amount of the volatile solvent to the mixing tank 147. The photosensitive material in the mixing tank 147 includes the volatile solvent from about 95 wt % to about 75 wt %.

The photosensitive material includes the solid powder supplied from the solid powder supplying unit 143 and the volatile solvent supplied from the solvent supplying unit 144. The photosensitive material may further include a drying delaying agent for controlling the drying time of the photosensitive material and a surfactant for controlling the surface tension of the photosensitive material.

The boiling point control unit 145 supplies the drying delaying agent to the mixing tank 147 that stores the solid powder and the volatile solvent. The boiling point control unit 145 may further include a control unit (not shown) to accurately supply an amount of the drying delaying agent to the mixing tank 147. The photosensitive material in the mixing tank 147 includes the drying delaying agent from about 10 wt % to about 80 wt %.

The surfactant supplying unit 146 supplies the surfactant to the mixing tank 147 that is storing the solid powder, the volatile solvent and the drying delaying agent. The surfactant supplying unit 145 may further include a control unit (not shown) to accurately supply an amount of the surfactant to the mixing tank 147. The photosensitive material in the mixing tank 147 includes the surfactant from about 200 ppm to about 5,000 ppm. The surfactant may also be a fluorine-containing surfactant.

The mixing tank 147 stores the solid powder, the volatile solvent, the drying delaying agent and the surfactant. The mixing tank 147 includes a stirrer (not shown) so as to completely mix the solid powder, the volatile solvent, the drying delaying agent and the surfactant.

The pump 141 pressurizes the inside of the mixing tank 147 so that the photosensitive material that is mixed with the additives is supplied into the slit coater 180.

Figure 10A:
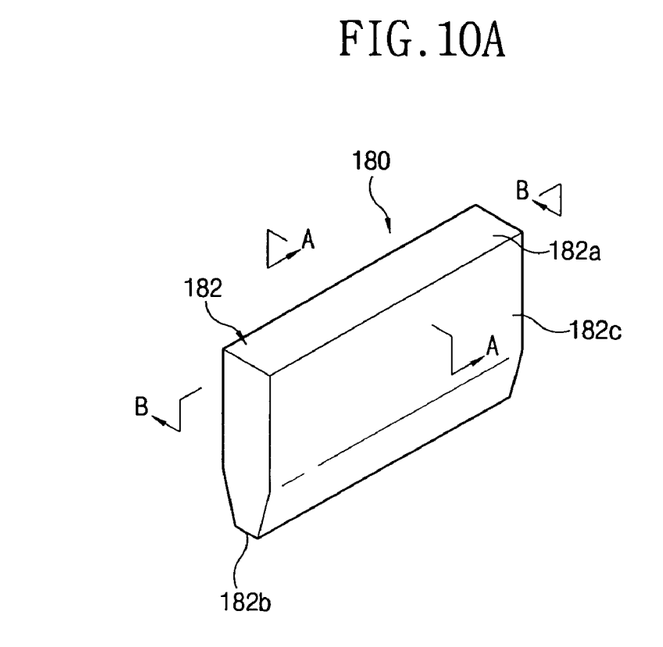
FIG. 10A is a perspective view showing a slit coater according to an exemplary embodiment of the present invention.
Figure 10B:
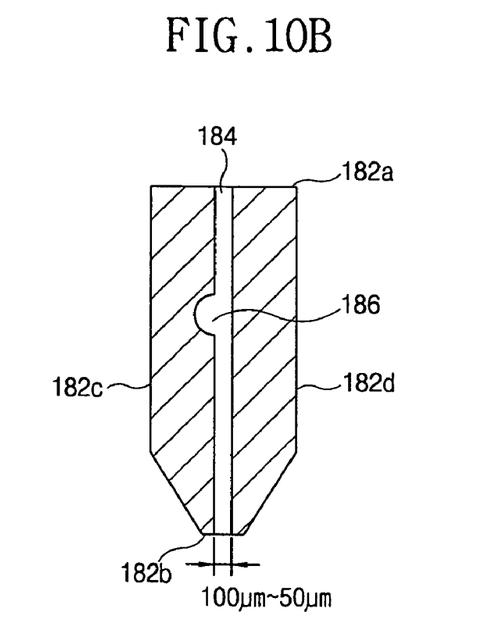
FIG. 10B is a cross-sectional view taken along the line "A-A" shown in FIG. 10A.
Figure 10C:
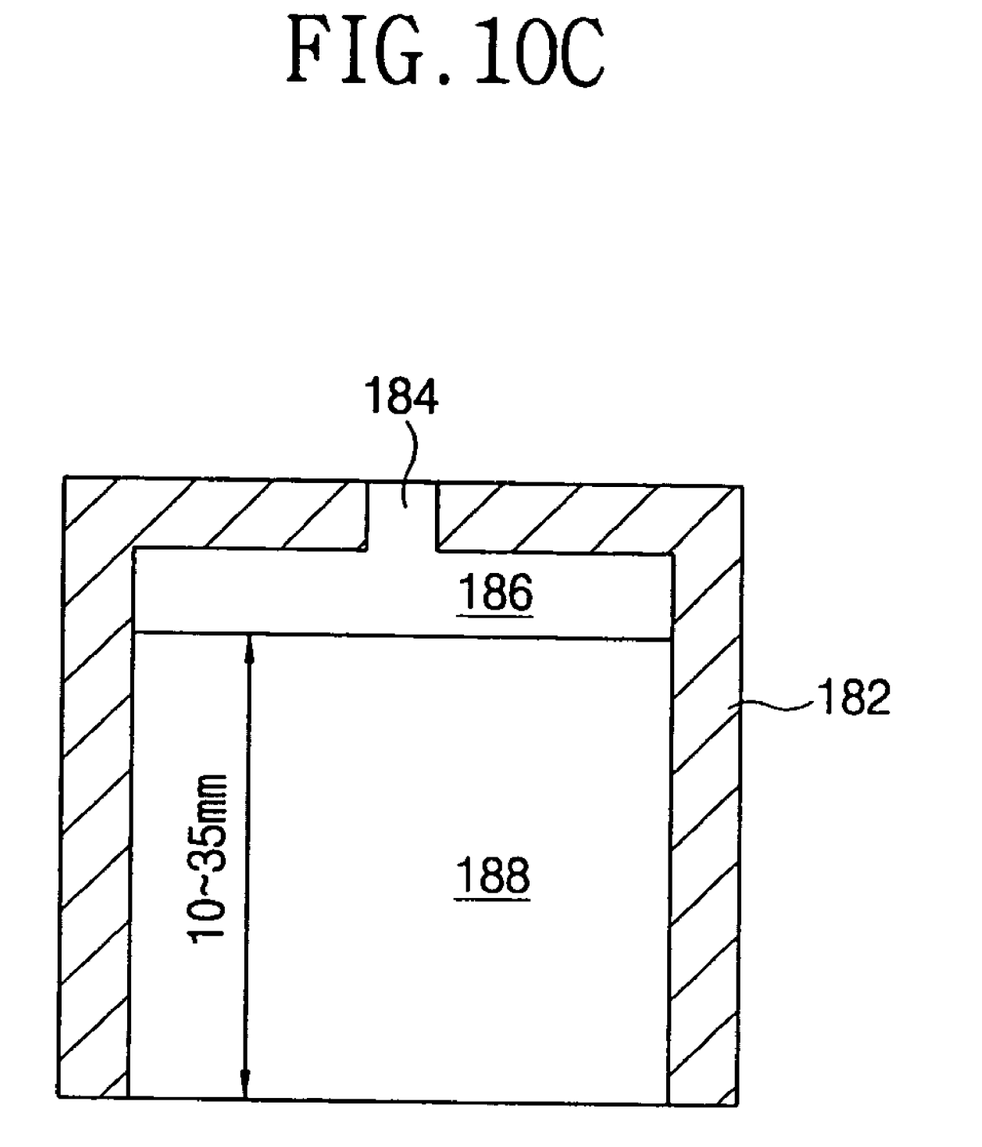
FIG. 10C is a cross-sectional view taken along the line "B-B" shown in FIG. 10A.

FIG. 10A is a perspective view showing a slit coater according to the exemplary embodiment of the present invention, FIG. 10B is a cross-sectional view taken along the line "A-A" shown in FIG. 10A, and FIG. 10C is a cross-sectional view taken along the line "B-B" shown in FIG. 10A.

Referring to FIGS. 10A to 10C, the slit coater 180 includes a body 182, a supply passageway 184, a buffer 186 and a slit nozzle 188.

The body 182 includes a photosensitive material supplying portion 182a, a photosensitive material discharging portion 182b and side portions 182c and 182d. As an exemplary embodiment of the present invention, the photosensitive material supplying portion 182a has a rectangular shape having a first width and a first length. The photosensitive material discharging portion 182b has a second width shorter than the first width and a second length same to the first length. The photosensitive material supplying portion 182a and the photosensitive material discharging portion 182b are disposed in parallel to each other. The side portions 182c and 182d connect the photosensitive material supplying portion 182a to the photosensitive material discharging portion 182b. The body 182 is provided with the supply passageway 184, the buffer 186 and the slit nozzle 188, which are disposed therein.

Referring to FIGS. 10B and 10C, the supply passageway 184 extends from the photosensitive material supplying portion 182a to the photosensitive material discharging portion 182b. The photosensitive material supplied from the photosensitive material supplying unit 140 is provided to the slit coater 180 through the supply passageway 184.

The buffer 186 is connected to the supply passageway 184 in a T shape. The buffer 186 buffers the photosensitive material supplied through the supply passageway 184 to be stably supplied to the photosensitive material discharging portion 182b. The buffer 186 has a tubular shape having a diameter from about 3 mm to about 5 mm.

The slit nozzle 188 is connected to the buffer 186. The slit nozzle 188 has a first width and a first length appropriate to discharge the photosensitive material having the band form. The first width of the slit nozzle 188 is from about 50 μm to about 100 μm and the first length of the slit nozzle 188 is from about 10 mm to about 35 mm.

Accordingly, the photosensitive material having the band form corresponding to the first width and the first length is discharged from the photosensitive material forming unit 100. In generally, the photosensitive material is not uniformly discharged at an initial stage from the photosensitive material forming unit 100.

In the exemplary embodiment of the present invention, the photosensitive material is coated on the substrate after the discharging amount of the photosensitive material discharged from the photosensitive material forming unit 100 is uniformly adjusted.

Referring to again FIG. 7, the photosensitive material discharged from the photosensitive material forming unit 100 is temporarily coated on the coating amount control unit 200. The coating amount control unit 200 includes a roller 210, a motor 220 for rotating the roller 210 and a blade 230 for removing the photosensitive material coated on the roller 210.

More particularly, the roller 210 has a length corresponding to the length of the photosensitive material discharged through the slit nozzle 188. The motor 220 is connected to a rotation shaft (not shown) of the roller 210. The photosensitive material from the photosensitive material forming unit 100 is supplied to the roller during a predetermined time period, for example, about 5 seconds.

Accordingly, the surface of the roller 210 is coated with the photosensitive material. The photosensitive material coated on the roller 210 is hardened with the lapse of time. The blade 230 removes the hardened photosensitive material on the roller 210. The blade 230 disposed adjacent to the roller 210 has a thin plate shape and a length corresponding to the length of the roller 210. A gap between the roller 210 and the photosensitive material discharging portion 182b is from about 10 μm to about 200 μm.

Referring to the FIG. 7, the fixing unit 300 fixes the substrate 310 using a vacuum suction method. The fixing unit 300 is disposed adjacent to the coating amount control unit 200.

The transferring unit 400 includes a transferring bar 430, a slit coater transferring unit 440 and a slit coater fixing unit 450. The transferring bar 430 includes two bars 410 and 420 (hereinafter, referred to as transferring bar 430) disposed in parallel to each other and extended in a direction to which the slit coater 180 is transferred. The slit coater transferring unit 440 is connected to the transferring bar 430. The slit coater transferring unit 440 transfers the slit coater 180 along the transferring bar 430 without trembling. The slit coater fixing unit 450 has a first end combined with the slit coater transfer unit 440 and a second end combined with the slit coater 180.

The gap control unit 600 is disposed between the slit coater fix unit 450 and the slit coater transfer unit 440 so as to lift the slit coater 180 up and down. The gap control unit 600 controls a gap between the slit coater 180 and the substrate 310. The gap between the slit coater 180 and the substrate 310 controlled by the gap control unit 600 is from about 50 μm to about 150 μm.

The gap measuring unit 700 is installed at the side portion 182c of the slit coater 180 and measures the gap between the slit coater 180 and the substrate 310. The photosensitive material coating apparatus 800 may include a pair of gap measuring units. The gap measuring unit 700 measures the gap in a manner such that a laser beam is irradiated to the substrate 310 and is reflected from the substrate 310.

Figure 11:
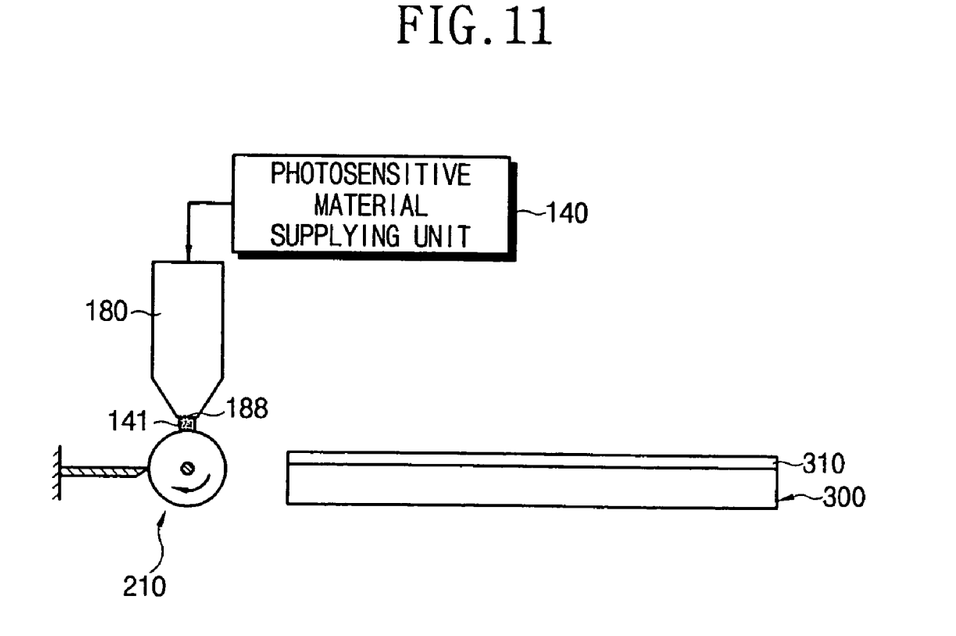
FIGS. 11 and 12 are schematic views showing a photosensitive material forming unit for supplying the photosensitive material to the coating amount controlling roller according to an exemplary embodiment of the present invention.
Figure 12:
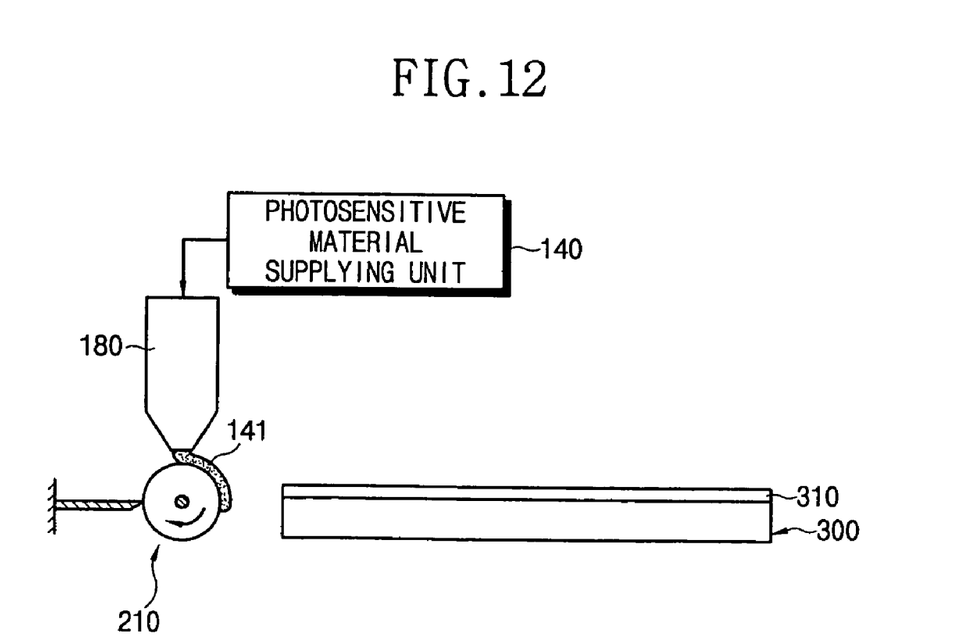

FIGS. 11 and 12 are schematic views showing a photosensitive material forming unit for supplying the photosensitive material to the coating amount controlling roller according to an exemplary embodiment of the present invention.

Referring to FIG. 11, the slit coater 180 of the photosensitive material forming unit 100 is transferred to the upper portion of the roller 210 of the coating amount control unit 200 by the transferring unit 400. Subsequently, the photosensitive material 141 from the photosensitive material supplying unit 140 is supplied to the roller 210 that is being rotated, through the slit nozzle 188 of the slit coater 180.

Referring to FIG. 12, the photosensitive material 141 is supplied to the roller 210 during the first time period so as to coat the photosensitive material on an end portion of the slit nozzle 188.

Figure 13:
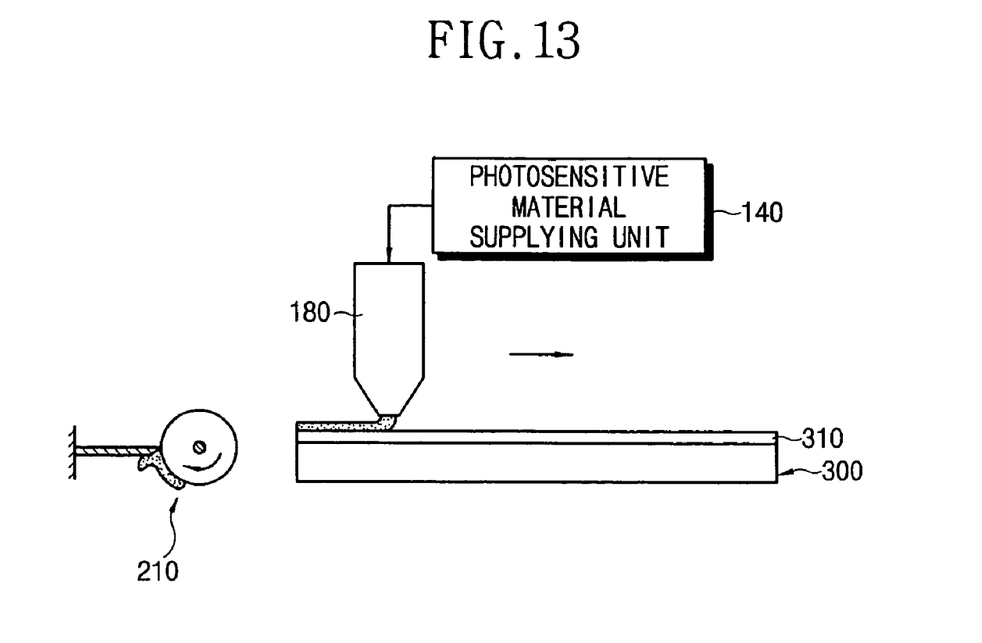
FIGS. 13 and 14 are schematic views showing the photosensitive material coated on the substrate according to an exemplary embodiment of the present invention.
Figure 14:
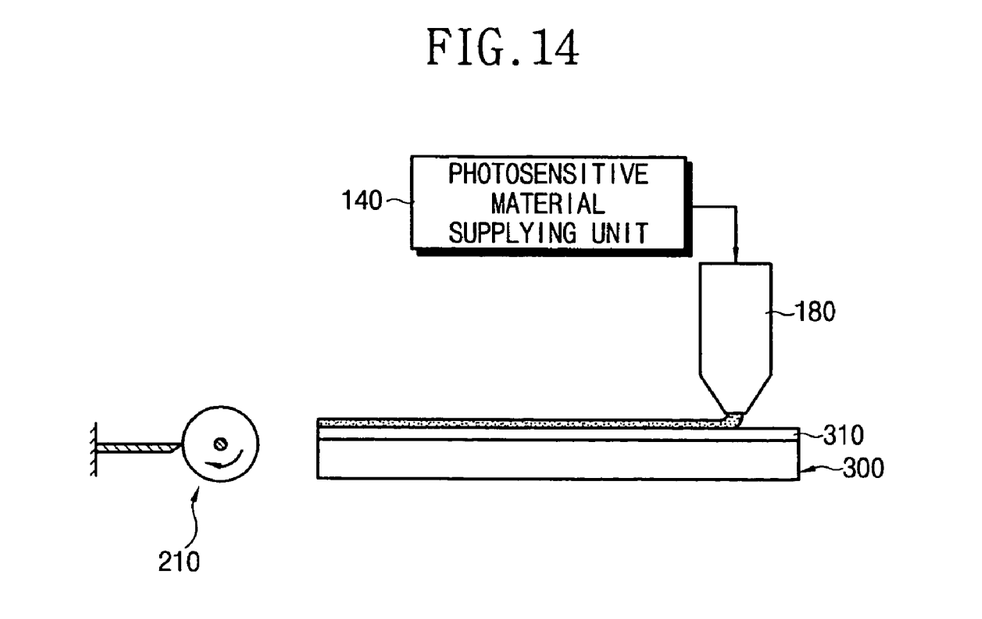

FIGS. 13 and 14 are schematic views showing the photosensitive material coated on the substrate according to an exemplary embodiment of the present invention.

Referring to FIG. 13, the slit coater 180 is transferred to the fixing unit 300 while the photosensitive material is not supplying from the photosensitive material supplying unit 140 after the first time period.

Subsequently, the slit coater 180 is transferred to the fixing unit 300 and stopped at a predetermined position. The photosensitive material supplying unit 140 applies the predetermined pressure to the photosensitive material during the second time period. Accordingly, the photosensitive material is discharged from the slit coater 180. The photosensitive material supplying apparatus 140 continuously supplies the photosensitive material to the substrate 310 during the third time period until the supplied amount of the photosensitive material reaches to a predetermined amount of the photosensitive material.

Referring to FIG. 14, the slit coater 180 begins the coating operation with movement by the transferring unit 400, thereby uniformly coating the photosensitive material on the substrate 310.

Although exemplary embodiments of the invention have been described, it will be understood by those skilled in the art that the present invention should not be limited to the described preferred embodiment, but various changes and modifications can be made within the spirit and scope of the invention as defined by the appended claims.

What is claimed is:

1. A method of operating an apparatus structured for coating an object with a photosensitive material where the apparatus includes a forming part structured for changing a fluid photosensitive material into a photosensitive material having a band form; a stabilizing part comprising a roller; and a fixing part structured for fixing the object, the method comprising:
   providing the photosensitive material in band form to the object from the forming part; and
   before said providing of the photosensitive material in band form to the object, first providing the photosensitive material in said band form to the roller from the forming part so as to thereby stabilize an amount of the photosensitive material that will next be provided in band form to the object.

2. The method of claim 1, wherein the forming part comprises:
   a supplier for supplying the fluid photosensitive material; and
   a slit coater for changing the fluid photosensitive material supplied from the supplier into a photosensitive material having a band form.

3. The method of claim 2, wherein the supplier comprises:
   a tank for receiving the photosensitive material; and
   a pump for pressurizing the photosensitive material in the tank.

4. The method claim 3, wherein the supplier comprises:
   a first tank for storing a solid powder;
   a second tank for storing a volatile solvent;
   a third tank for storing a boiling point control agent;
   a mixing tank respectively connected to the first to third tanks; and
   a pump connected to the mixing tank.

5. The method of claim 3, wherein the supplies comprises:
   a first tank for storing a solid powder;
   a second tank for storing a volatile solvent;
   a third tank for storing a surfactant;
   a mixing tank respectively connected to the first to third tanks; and
   a pump connected to the mixing tank.

6. The method of claim 2, wherein the slit coater comprises:
   a body;
   a supply passageway disposed inside the body, for supplying the photosensitive material;
   a buffer having a long hollow shape for storing the photosensitive material supplied from the supply passageway; and
   a slit nozzle connected to the buffer, for discharging the photosensitive material having the band form.

7. The method of claim 6, wherein a diameter of the buffer is from about 3 mm to about 5 mm.

8. The method of claim 7, wherein a length of the slit nozzle is from about 10 mm to about 35mm and a width thereof is from about 50 μm to about 100 μm.

9. The method claim 8, wherein the slit coater comprises:
   a sensor for measuring a gap between the object and the slit coater; and
   a controller for controlling the gap.

10. The method of claim 3, wherein the photosensitive material comprises a solid powder, a volatile solvent, a boiling point control agent for controlling a boiling point of the volatile solvent and a surfactant.

11. The method of claim 9, wherein a gap between the forming part and the roller is from about 10 μm to about 200 μm.

* * * * *